(12) United States Patent
Lee et al.

(10) Patent No.: US 9,929,207 B2
(45) Date of Patent: *Mar. 27, 2018

(54) LIGHT-EMITTING DEVICE AND METHOD FOR MANUFACTURING THE SAME

(71) Applicant: EPISTAR CORPORATION, Hsinchu (TW)

(72) Inventors: Rong-Ren Lee, Hsinchu (TW); Cheng-Hong Chen, Hsinchu (TW); Chih-Peng Ni, Hsinchu (TW); Chun-Yu Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/059,936

(22) Filed: Mar. 3, 2016

(65) Prior Publication Data

US 2016/0190205 A1 Jun. 30, 2016

Related U.S. Application Data

(63) Continuation of application No. 14/204,764, filed on Mar. 11, 2014, now Pat. No. 9,312,303, which is a continuation-in-part of application No. 13/517,830, filed on Jun. 14, 2012, now abandoned.

(51) Int. Cl.
| | | |
|---|---|---|
| *H01L 27/15* | (2006.01) | |
| *H01L 33/10* | (2010.01) | |
| *H01L 49/02* | (2006.01) | |
| *H01L 33/38* | (2010.01) | |
| *H01L 33/62* | (2010.01) | |
| *H01L 33/02* | (2010.01) | |
| *H01L 33/20* | (2010.01) | |

(52) U.S. Cl.
CPC ............. *H01L 27/15* (2013.01); *H01L 28/20* (2013.01); *H01L 33/10* (2013.01); *H01L 33/38* (2013.01); *H01L 33/62* (2013.01); *H01L 33/025* (2013.01); *H01L 33/20* (2013.01); *H01L 2924/0002* (2013.01)

(58) Field of Classification Search
CPC ........ H01L 27/15; H01L 33/025; H01L 33/10
USPC ......................................................... 257/98
See application file for complete search history.

(56) References Cited

U.S. PATENT DOCUMENTS

2006/0163660 A1* 7/2006 Jin ....................... H01L 27/0259
257/361
2009/0208725 A1* 8/2009 Bailey ................... C23C 16/402
428/312.2

(Continued)

*Primary Examiner* — Bo Fan
(74) *Attorney, Agent, or Firm* — Ditthavong & Steiner, P.C.

(57) ABSTRACT

A light-emitting device is provided. The light-emitting device comprises: a semiconductor structure comprising a first type semiconductor layer, a second type semiconductor layer, and an active layer between the first type semiconductor layer and the second type semiconductor layer; and an isolation region through the second type semiconductor and the active layer to separate the semiconductor structure into a first part and a second part on the first substrate; wherein the second part functions as a low-resistance resistor and loses its make diode behavior, the active layer in the first part is capable of generating light, and the active layer in the second part is incapable of generating light.

20 Claims, 16 Drawing Sheets

(56) References Cited

U.S. PATENT DOCUMENTS

2011/0117726 A1* 5/2011 Pinnington ....... H01L 21/02389
438/458
2011/0316039 A1* 12/2011 Liu ........................ H01L 33/38
257/99

* cited by examiner

LIGHT-EMITTING DEVICE AND METHOD FOR MANUFACTURING THE SAME

REFERENCE TO RELATED APPLICATION

This application is a continuation application of a previously filed U.S. patent application Ser. No. 14/204,764 filed on Jul. 10, 2014, entitled as "LIGHT-EMITTING DEVICE AND METHOD FOR MANUFACTURING THE SAME", which is a continuation-in-part of U.S. patent application Ser. No. 13/517,830, entitled "LIGHT-EMITTING DEVICE AND METHOD FOR MANUFACTURING THE SAME", filed on Jun. 14, 2012. The disclosures of all references cited herein are incorporated by reference.

TECHNICAL FIELD

The present application relates to a light-emitting device and the method for manufacturing the same, and more particularly to a light-emitting device comprising a first part and a second part.

BACKGROUND

The light radiation theory of light-emitting device is to generate light from the energy released by the electrons moving between the n-type semiconductor layer and the p-type semiconductor layer. Because the light radiation theory of light-emitting device is different from the incandescent light which heats the filament, the light-emitting device is called a "cold" light source.

The light-emitting device mentioned above may be mounted with the substrate upside down onto a submount via a solder bump or a glue material to form a light-emitting apparatus. Besides, the submount further comprises one circuit layout electrically connected to the electrode of the light-emitting device via an electrical conductive structure such as a metal wire.

Moreover, the light-emitting device is more sustainable, long-lived, light and handy, and less power consumption, therefore it is considered as a new light source for the illumination market. The light-emitting device applies to various applications like the traffic signal, backlight module, street light and medical instruments, and is gradually replacing the traditional lighting sources.

SUMMARY

A light-emitting device is provided. The light-emitting device comprises: a semiconductor structure comprising a first type semiconductor layer, a second type semiconductor layer, and an active layer between the first type semiconductor layer and the second type semiconductor layer; and an isolation region through the second type semiconductor and the active layer to separate the semiconductor structure into a first part and a second part on the first substrate; wherein the second part functions as a low-resistance resistor and loses its make diode behavior, the active layer in the first part is capable of generating light, and the active layer in the second part is incapable of generating light.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein.

DETAILED DESCRIPTION OF THE PREFERRED EMBODIMENTS

The present application discloses a light-emitting device and a method for manufacturing the same. In order to make the illustration of the present application more explicit, the following description is stated with reference to FIG. 1 through FIG. 6.

Figure 1A:
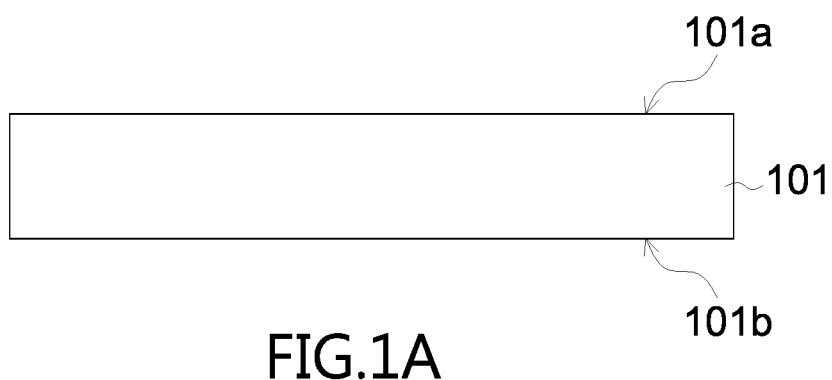
FIG. 1A through FIG. 1G are schematic diagrams showing the process flow for manufacturing a light-emitting device in accordance with a first embodiment of the present application.
Figure 1B:
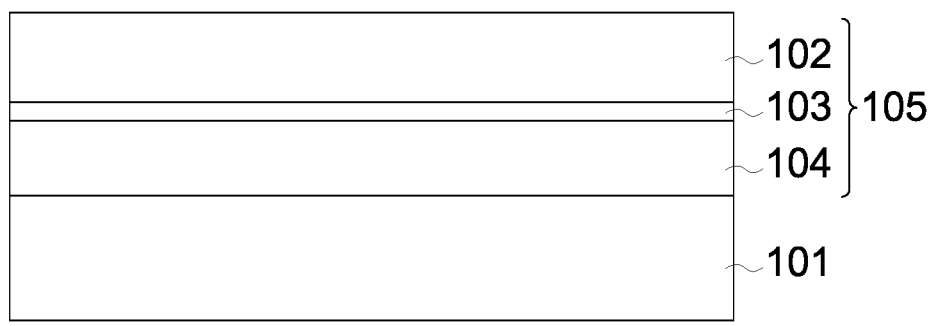
Figure 1C:
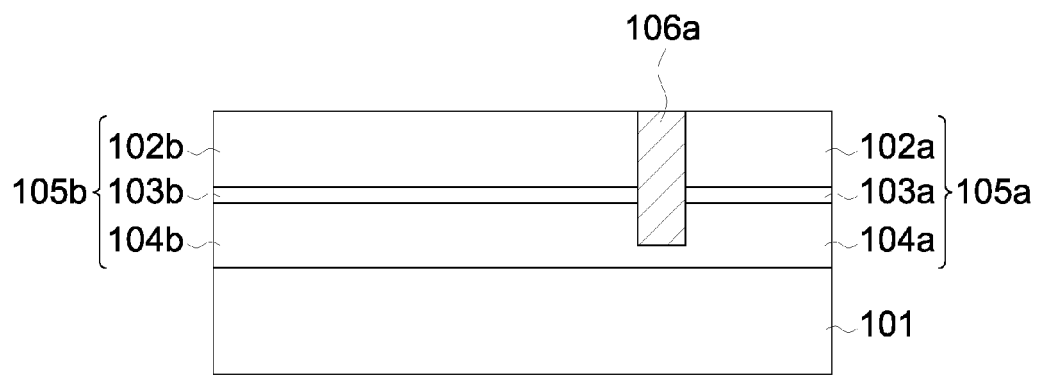
Figure 1D:
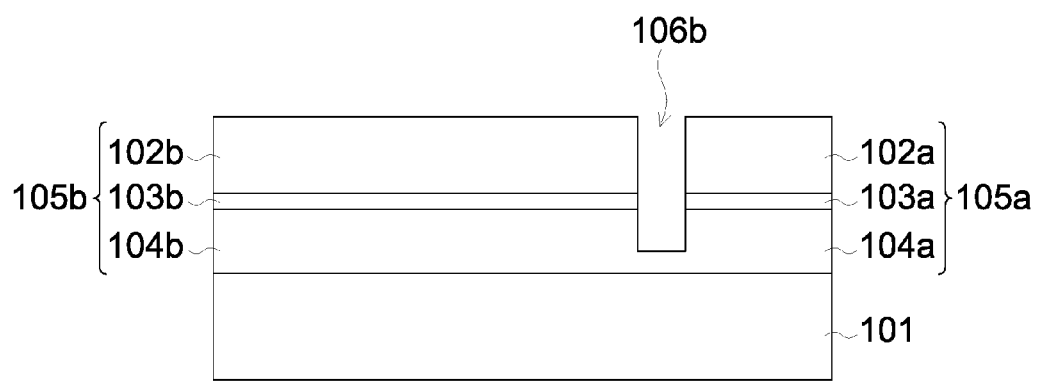
Figure 1E:
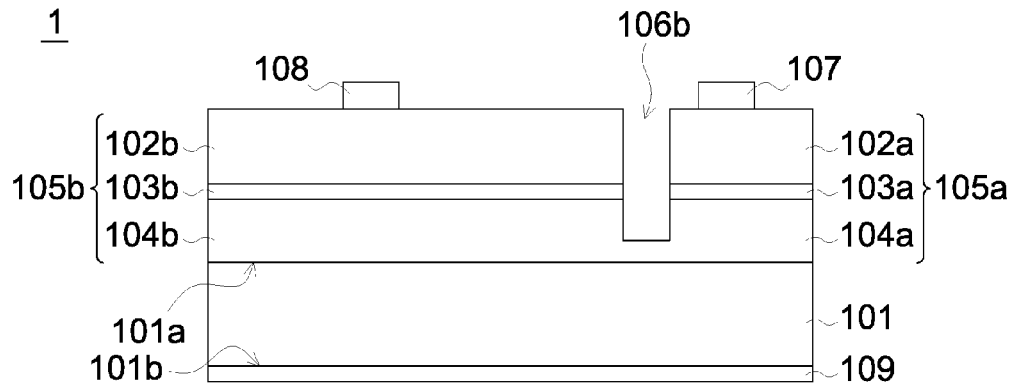
Figure 1E:
Figure 1F:
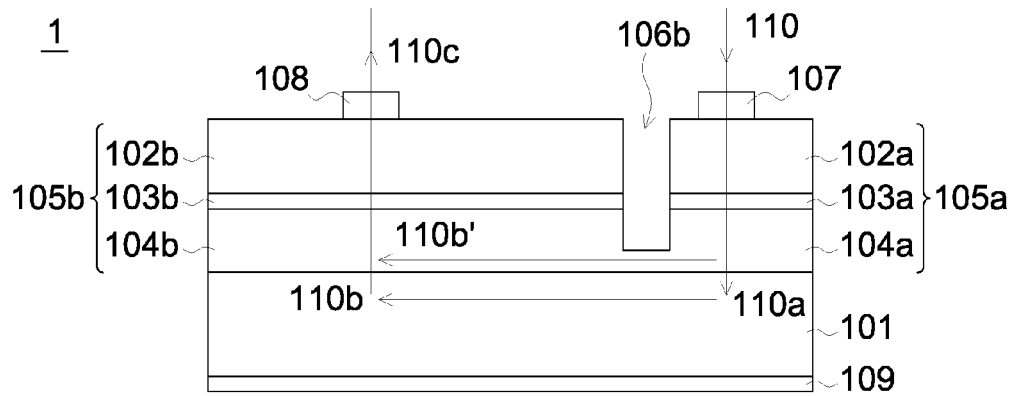
Figure 1F:
Figure 1G:
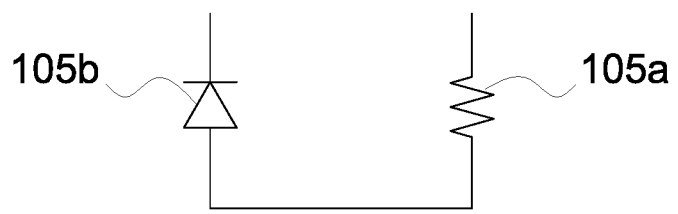
Figure 2A:
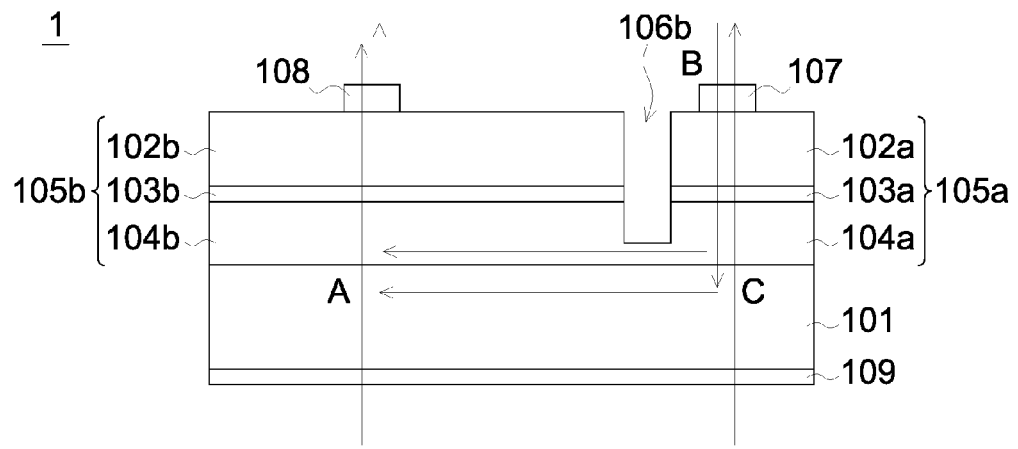
FIG. 2A is a schematic diagram showing the current path for testing a light-emitting device in accordance with a first embodiment of the present application.
Figure 2B:
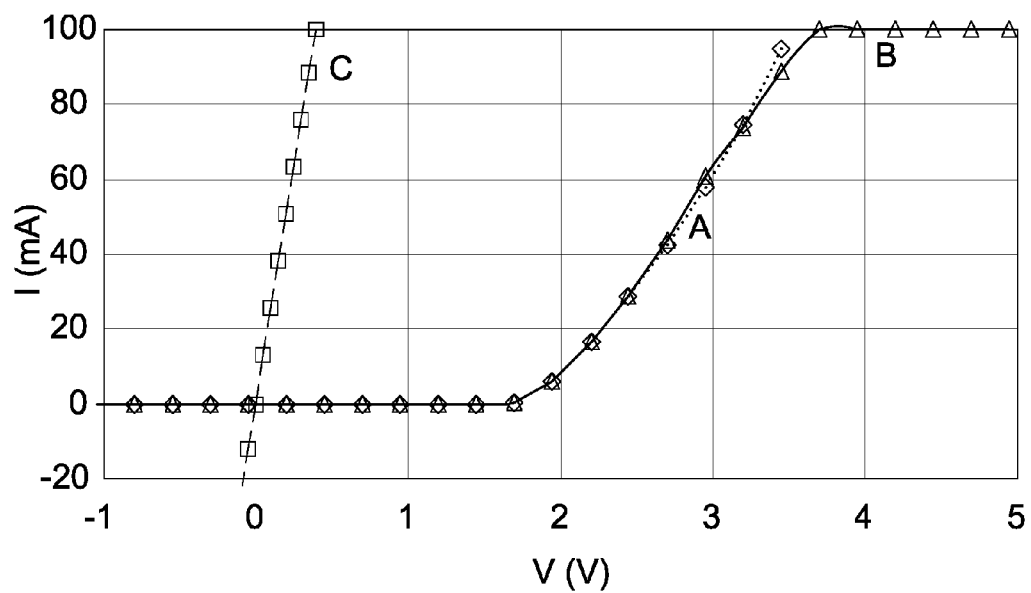
FIG. 2B is a schematic diagram showing the I-V test for a light-emitting device in accordance with a first embodiment of the present application.

FIG. 1A through FIG. 1G are schematic diagrams showing the process flow for manufacturing a light-emitting device 1 in accordance with a first embodiment of the present application. As FIG. 1A shows, a substrate 101 is provided for epitaxial growth, wherein the substrate 101 having a first surface 101a and a second surface 101b. In the embodiment, the material of the substrate 101 may be GaAs. Next, a semiconductor structure 105 is grown on the first surface 101a of the substrate 101 by, for example, metal organic chemical vapor deposition (MOCVD) method, liquid phase deposition (LPD) method, or molecular beam epitaxy (MBE) method. The semiconductor structure 105 comprises a second type semiconductor layer 104, an active layer 103, and a first type semiconductor layer 102 stacked on the first surface 101a of the substrate 101, as shown in FIG. 1B. In the embodiment, the first type semiconductor layer 102 is n-type AlGaInP series material, the active layer 103 is AlGaInP series material, and the second type semiconductor layer 104 is p-type AlGaInP series material. Then, as FIG. 1C shows, an isolation region 106a penetrating the active layer 103 in the semiconductor structure 105 is formed by an ion implantation. More specifically, the isolation region 106a is formed through the first type semiconductor layer 102 and the active layer 103, and reaches the second type semiconductor layer 104. Furthermore, the isolation region 106a separates the semiconductor structure 105 into a first part 105b and the second part 105a so the active layer 103 is also separated into a first part 103b and a second part 103a. In another embodiment, the isolation region comprises a trench 106b formed by a wet etching or a dry etching, as shown in FIG. 1D. Then, a second electrode 108 is formed on the first type semiconductor layer 102b of the first part of the semiconductor structure 105b, and a first electrode 107 is formed on the first type semiconductor layer 102a of the second part of the semiconductor structure 105a, so the second electrode 108 and the first electrode 107 are the same conductivity type. The first electrode 107 and the second electrode 108 can be formed simultaneously with the same material. A third electrode 109 is formed on the second surface 101b of the substrate 101 as shown in FIG. 1E(a). The third electrode 109 electrically connects with the second type semiconductor layer 104 so its conductivity type is different from the second electrode 108 and the first electrode 107. The material of the electrodes 107, 108 and 109 comprises metal material such as Cr, Ti, Ni, Pt, Cu, Au, Al, W, Sn, or Ag. FIG. 1E(b) is an equivalent-circuit diagram of the light-emitting device 1 demonstrating the first part 105b and the second part of the semiconductor structure 105a are in reverse polarity series connection. Next, an electrical current is injected across the first electrode 107 and the second electrode 108 to cause a reverse-bias to the second part of the semiconductor structure 105a and a forward-bias to the first part of the semiconductor structure 105b simultaneously. Specifically, a high current density current 110 is injected to the first electrode 107 and goes through the light-emitting device 1, and the paths of the current 110 are shown in FIG. 1F(a). The current 110 goes through the second part of the semiconductor structure 105a from the first type semiconductor layer 102a to the second type semiconductor layer 104a to form a path 110a, goes through the substrate 101 horizontally to form a path 110b, goes through the second type semiconductor layer 104 below the trench 106b region horizontally to form a path 110b', and flows to the second electrode 108 through the first part of the semiconductor structure 105b from the second type semiconductor layer 104b to the first type semiconductor layer 102b to form a path 110c. FIG. 1F(b) is an equivalent-circuit diagram of the light-emitting device in FIG. 1F(a). The electrical current 110 from a power supply is applied to the second part 105a of the semiconductor structure such that the current density (defined by the current 110 divided by the total surface area of the light-emitting device 1) is high enough to cause the second part of the semiconductor structure 105a to be reverse-biased and exceed the breakdown voltage $V_{bd}$ of the second part of the semiconductor structure 105a, therefore the diode behavior of the second part 105a of the semiconductor structure is permanently destroyed. As a result, the second part of the semiconductor structure 105a becomes a resistor having a general low resistance such that the second part of the semiconductor structure 105a is capable of allowing a current passing through either in forward direction from the first electrode 107 to the second electrode 108 or in reverse direction from the third electrode 109 to the first electrode 107 as shown in FIG. 2A after the diode behavior of the second part 105a of the semiconductor structure is permanently broken-down. Namely, when forward-biasing the first part of the semiconductor structure 105b, the electrical current 110 is able to flow through the first electrode 107, the second part of the semiconductor structure 105a, the first part of the semiconductor structure 105b, and the second electrode 108 to emit light during normal operation after the diode behavior of the second part of the semiconductor structure 105a is permanently broken-down. In the embodiment, the current density of the current 110 applied to the second part of the semiconductor structure 105a is greater than 80 A/cm$^2$ or to about 200 A/cm$^2$ with a duration of 0.1 to 1 second such that the reverse-biasing voltage across the second part of the semiconductor structure 105a exceeds the breakdown voltage of the second part of the semiconductor structure 105a to cause the diode behavior of the second part of the semiconductor structure 105a to be permanently broken-down. In one of the embodiments, the area of the light-emitting device 1 is 12 mils by 12 mils, and a preferable current density applied to the light-emitting device 1 is about 110 A/cm$^2$ and a preferable duration is about 0.5 second for causing the diode behavior of the second part 105a of the semiconductor structure to be permanently destroyed and preventing the second part 105a from forming a permanently open circuit. Specifically, to obtain the same result as mentioned above, the current density is inversely proportional to the duration of the current density, for example, when the duration is about 0.1 second, the current density is not more than 200 A/cm$^2$. Furthermore, the current is substantially conducted through the semiconductor material of the second part of the semiconductor structure 105a. After the diode behavior of the second part of the semiconductor structure 105a is permanently broken-down, only the first part of the active layer 103b can generate the electromagnetic radiation during operation of the light-emitting device 1 while the second part of the active layer 103a can not generate the electromagnetic radiation. FIG. 1G is an equivalent-circuit diagram of the light-emitting device 1 after the high current density current 110 is injected to the first electrode 107 and goes through the light-emitting device 1 to cause the diode behavior of the second part of the semiconductor structure 105a to be permanently broken-down. The current paths go through the light-emitting device 1 during the I-V test are shown in FIG. 2A. Injecting a testing current from the third electrode 109 of the light-emitting device 1 through the first part of the semiconductor structure 105b from the second type semiconductor layer 104b to the first type semiconductor layer 102b to form a path A, then obtaining a current vs. voltage curve A as shown in the FIG. 2B. Injecting a testing current from the first electrode 107 to the second electrode 108 through the second part of the semiconductor structure 105a from the first type semiconductor layer 102a to the second type semiconductor layer 104a, through the substrate 101 horizontally and through the second type semiconductor layer 104 below the trench 106b region horizontally respectively, and through the first part of the semiconductor structure 105b from the second type semiconductor layer 104b to the first type semiconductor layer 102b to form a path B, then obtaining a current vs. voltage curve B as shown in the FIG. 2B. Injecting a testing current from the third electrode 109 to the first electrode 107 through the second part of the semiconductor structure 105a from the second type semiconductor layer 104a to the first type semiconductor layer 102a to form a path C, then obtaining a current vs. voltage curve C as shown in the FIG. 2B, which indicates that the second part of the semiconductor structure 105a forms a resistor with a resistance lower than that of the first part of the semiconductor structure 105b (the slope of curve C is steeper than the slope of curve A). The trend of the curve A and the curve B is substantially the same and indicates the electrical property of the path B is the same as the electrical property of the path A in the light-emitting device 1, which means the first part of the semiconductor structure 105b in the light-emitting device 1 can operate normally after the high current density current 110 is injected to the first electrode 107 and flows along the path B.

Figure 3A:
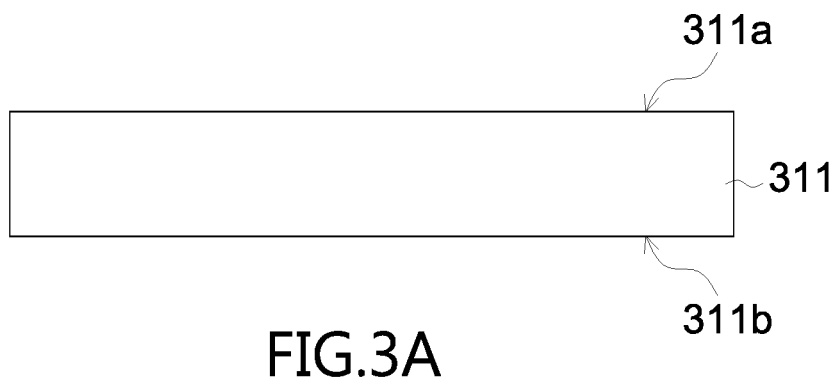
FIG. 3A through FIG. 3I are schematic diagrams showing the process flow for manufacturing a light-emitting device in accordance with a second embodiment of the present application.
Figure 3B:
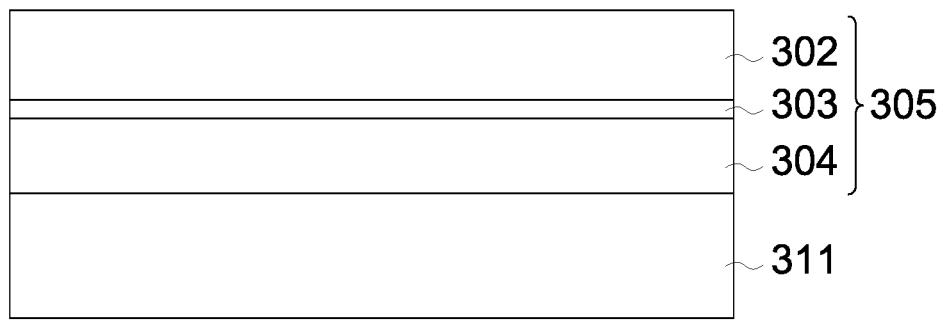
Figure 3C:
Figure 3D:
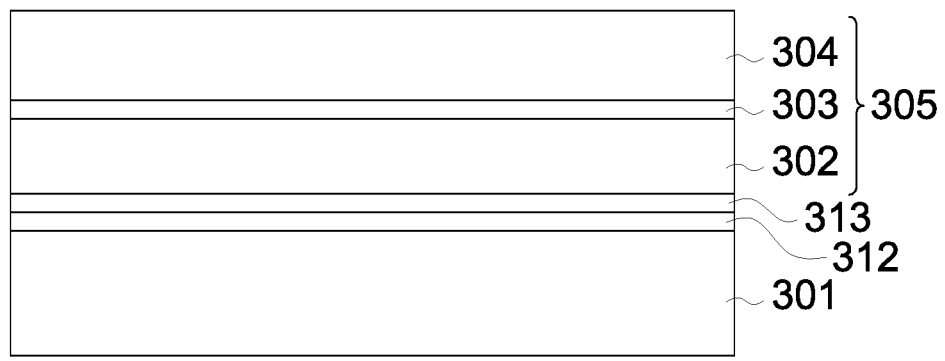

FIG. 3A through FIG. 3I are schematic diagrams showing the process flow for manufacturing a light-emitting device 2 in accordance with a second embodiment of the present application. As FIG. 3A shows, a growth substrate 311 is provided for epitaxial growth, wherein the growth substrate 311 having a first surface 311a and a second surface 311b. In the embodiment, the material of the growth substrate 311 may be GaAs. A semiconductor structure 305 is grown on the first surface 311a of the growth substrate 311 by, for example, metal organic chemical vapor deposition (MOCVD) method, liquid phase deposition (LPD) method, or molecular beam epitaxy (MBE) method. The semiconductor structure 305 comprises a second type semiconductor layer 304, an active layer 303, and a first type semiconductor layer 302 stacked on the first surface 311a of the growth substrate 311, as shown in FIG. 3B. In the embodiment, the first type semiconductor layer 302 is n-type AlGaInP series material, the active layer 303 is AlGaInP series material, and the second type semiconductor layer 304 is p-type AlGaInP series material. As FIG. 3C shows, a substrate 301 is provided, a reflecting layer 312 is formed on the substrate 301, and a bonding layer 313 is formed on the reflecting layer 312. In FIG. 3D, the semiconductor structure 305 shown in FIG. 3B is connected with the structure shown in FIG. 3C by the bonding layer 313. Then the growth substrate 311 is removed by selectively etching, lapping, polishing, wafer lift-off, or the combination thereof (not shown). The first type semiconductor layer 302 comprises a first surface (not labeled) and a second surface opposite to the first surface. The second type semiconductor layer 304 comprises a third surface (not labeled) facing the first type semiconductor layer 302 and a fourth surface (not labeled) opposite to the third surface. The active layer 303 comprises a fifth surface (not labeled) connecting the second surface and a sixth surface (not labeled) connecting the third surface.

The substrate 301 is conductive, wherein the material of the substrate 301 comprises metal such as Cu, Al, Mo, metal alloy such as Cu—Sn, Cu—Zn, conductive oxide such as ZnO, SnO, or semiconductor such as Si, AlN, GaAs, SiC, or GaP. The bonding layer 313 is conductive, wherein the material of the bonding layer 313 comprises metal, silver glue, conductive polymer, polymer materials mixed with conductive materials, or anisotropic conductive film.

Figure 3E:
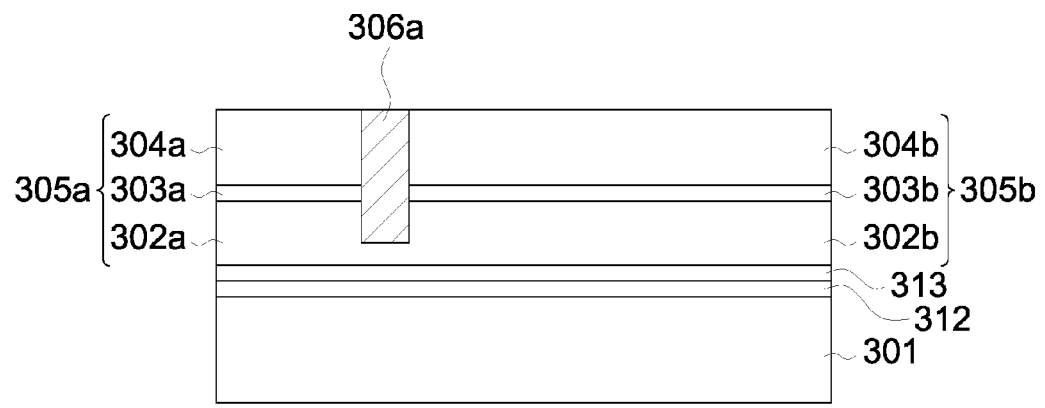
Figure 3F:
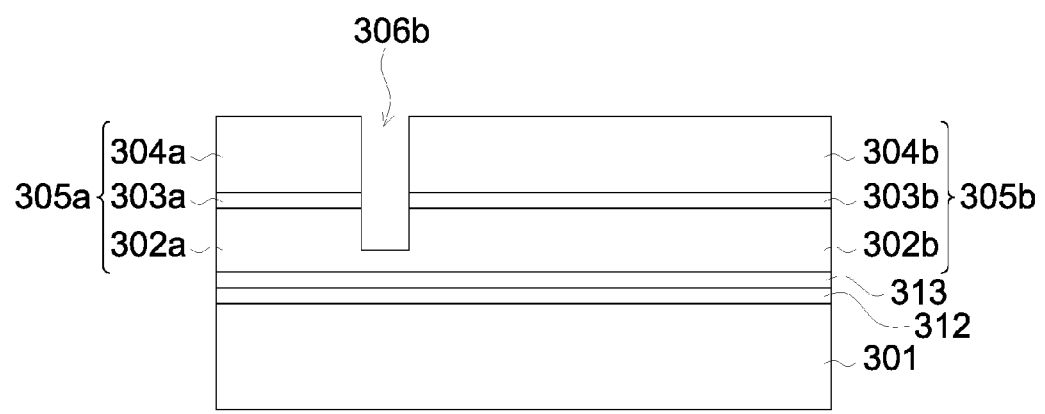
Figure 3G:
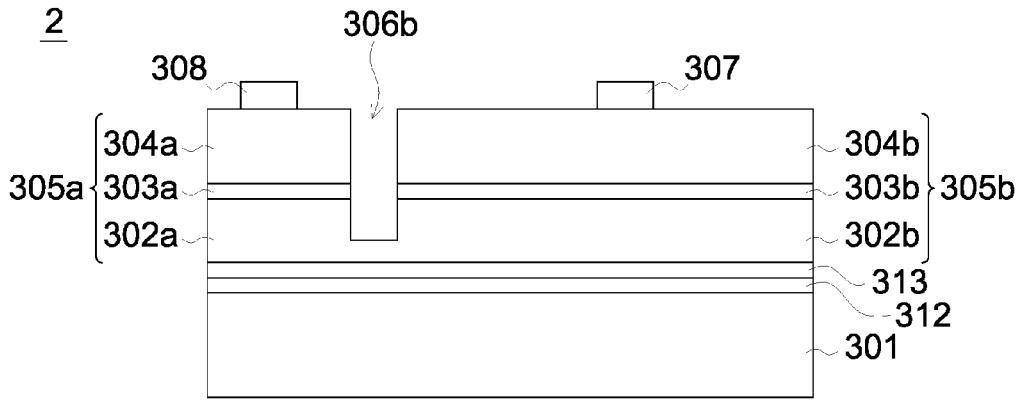
Figure 3G:
Figure 3H:
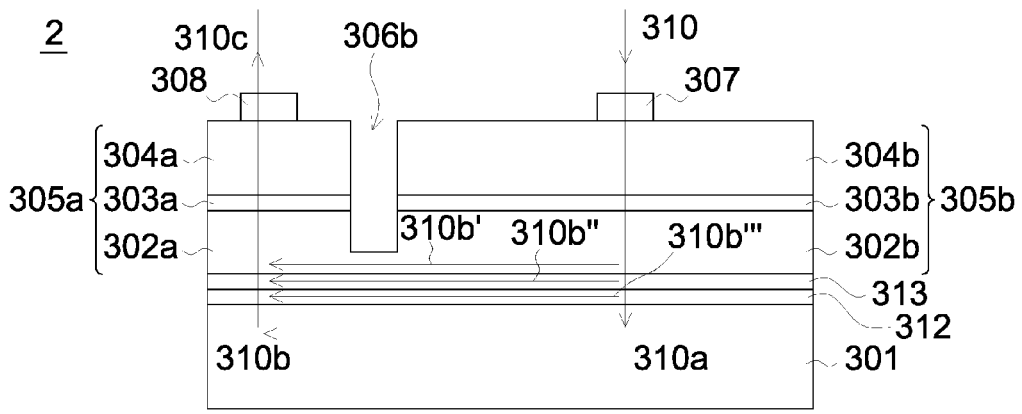
Figure 3H:
Figure 3I:
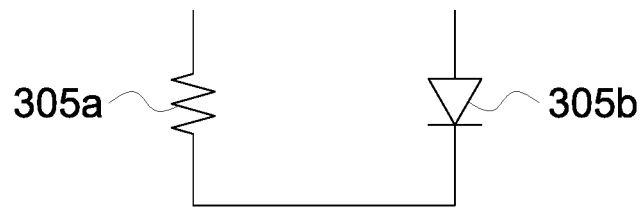

As FIG. 3E shows, an isolation region 306a penetrating the active layer 303 in the semiconductor structure 305 is formed by an ion implantation. More specifically, the isolation region 306a is formed through the second type semiconductor layer 304 and the active layer 303, and reaches the first type semiconductor layer 302 proximal to the substrate 301. The trench 306b penetrates through the fourth surface, the third surface of the second type semiconductor 304, the fifth surface and the sixth surface of the active layer 303. Furthermore, the trench 306b penetrates through the second surface of the first type semiconductor layer 302. Specifically, the trench 306b is not through the first surface of the first type semiconductor layer 302. Furthermore, the isolation region 306a separates the semiconductor structure 305 into a first part 305b and the second part 305a so the active layer 303 is also separated into a first part 303b and a second part 303a. In another embodiment, the isolation region comprises a trench 306b formed by a wet etching or a dry etching, as shown in FIG. 3F. A second electrode 308 is formed on the second type semiconductor layer 304a of the second part of the semiconductor structure 305a, and a first electrode 307 is formed on the second type semiconductor layer 304b of the first part of the semiconductor structure 305b, so the second electrode 308 and the first electrode 307 are the same conductivity type. The first electrode 307 and the second electrode 308 can be formed simultaneously with the same material. Then a light-emitting device 2 is formed as shown in FIG. 3G(a). The material of the electrodes 307 and 308 comprises metal material such as Cr, Ti, Ni, Pt, Cu, Au, Al, W, Sn, or Ag. FIG. 3G(b) is an equivalent-circuit diagram of the light-emitting device 2 demonstrating the first part 305b and the second part of the semiconductor structure 305a are in reverse polarity series connection. An electrical current is injected across the first electrode 307 and the second electrode 308 to cause a reverse-bias to the second part of the semiconductor structure 305a and a forward-bias to the first part of the semiconductor structure 305b simultaneously. Specifically, a high current density current 310 is injected to the first electrode 307 and goes through the light-emitting device 2, and the paths of the current 310 are shown in FIG. 3H(a). The current 310 goes through the first part of the semiconductor structure 305b from the second type semiconductor layer 304b to the first type semiconductor layer 302b to form a path 310a, goes through the substrate 301 horizontally to form a path 310b, goes through the first type semiconductor layer 302 below the trench 306b region horizontally to form a path 310b', goes through the bonding layer 313 horizontally to form a path 310b'', goes through the reflecting layer 312 horizontally to form a path 310b''' and flows to the second electrode 308 through the second part of the semiconductor structure 305a from the first type semiconductor layer 302a to the second type semiconductor layer 304a to form a path 310c. In the embodiment, the current density of the current 310 applied to the second part of the semiconductor structure 305a is greater than 80 A/cm$^2$ or to about 200 A/cm$^2$ with a duration of 0.1 to 1 second such that the reverse-biasing voltage across the second part of the semiconductor structure 305a exceeds the breakdown voltage of the second part of the semiconductor structure 305a to cause the diode behavior of the second part of the semiconductor structure 305a to be permanently broken-down for forming an electrically conductive path and preventing from forming an open circuit. FIG. 3H(b) is an equivalent-circuit diagram of the light-emitting device in FIG. 3H(a). After the diode behavior of the second part of the semiconductor structure 305a is permanently broken-down, only the first part of the active layer 303b can generate the electromagnetic radiation during operation of the light-emitting device 2 while the second part of the active layer 303a can not generate the electromagnetic radiation because a resistor with a low resistance is formed. FIG. 3I is an equivalent-circuit diagram of the light-emitting device 2 after the high current density 310 is injected across the first electrode 307 and the second electrode 308 and goes through the light-emitting device 2.

Figure 4A:
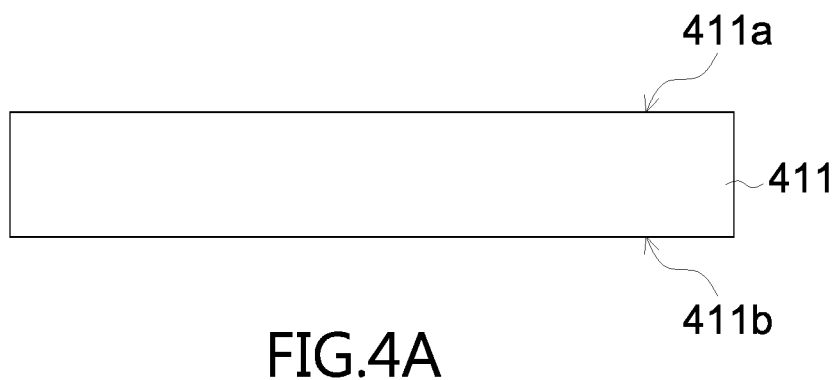
FIG. 4A through FIG. 4I are schematic diagrams showing the process flow for manufacturing a light-emitting device in accordance with a third embodiment of the present application.
Figure 4B:
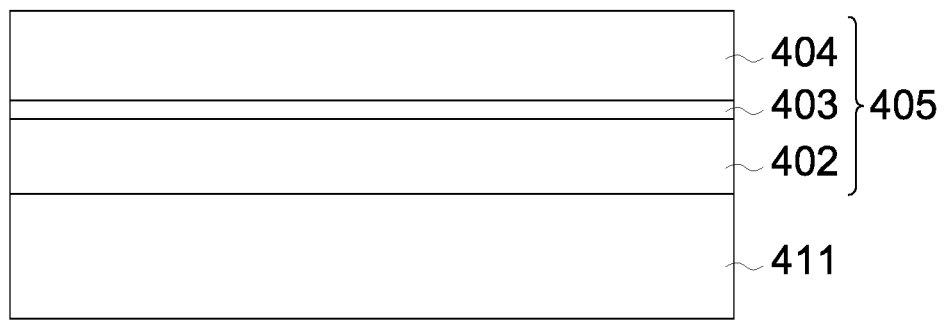
Figure 4C:
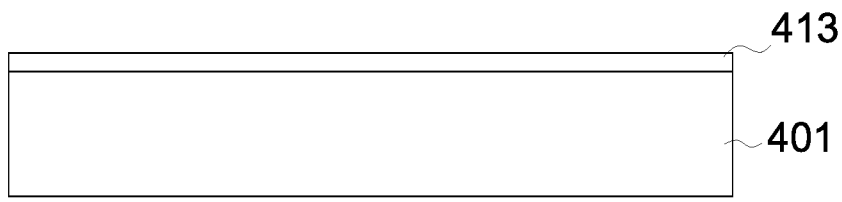
Figure 4D:
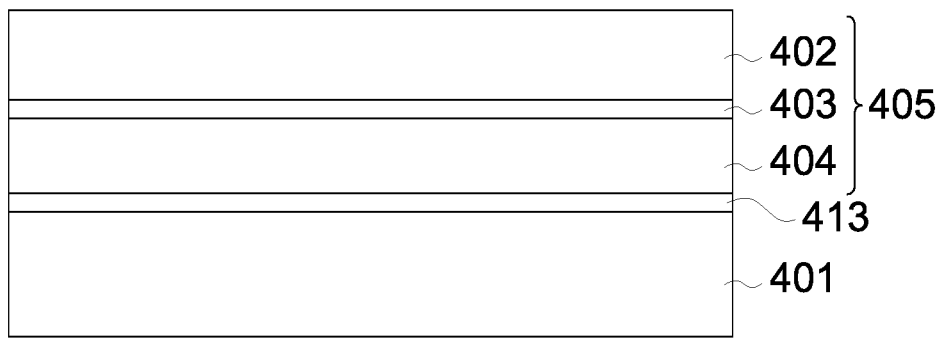

FIG. 4A through FIG. 4I are schematic diagrams showing the process flow for manufacturing a light-emitting device 3 in accordance with a third embodiment of the present application. As FIG. 4A shows, a growth substrate 411 is provided for epitaxial growth, wherein the growth substrate 411 having a first surface 411a and a second surface 411b. In the embodiment, the material of the growth substrate 411 may be GaAs. A semiconductor structure 405 is grown on the first surface 411a of the growth substrate 411 by, for example, metal organic chemical vapor deposition (MOCVD) method, liquid phase deposition (LPD) method, or molecular beam epitaxy (MBE) method. The semiconductor structure 405 comprises a first type semiconductor layer 402, an active layer 403, and a second type semiconductor layer 404 stacked on the first surface 411a of the growth substrate 411, as shown in FIG. 4B. In the embodiment, the first type semiconductor layer 402 is n-type AlGaInP series material, the active layer 403 is AlGaInP series material, and the second type semiconductor layer 404 is p-type AlGaInP series material. As FIG. 4C shows, a substrate 401 is provided, and a bonding layer 413 is formed on the substrate 401. In FIG. 4D, the semiconductor structure 405 shown in FIG. 4B is connected with the structure shown in FIG. 4C by the bonding layer 413. Then the growth substrate 411 is removed by selectively etching, lapping, polishing, wafer lift-off, or the combination thereof (not shown).

The substrate 401 is non-conductive, wherein the material of the substrate 401 comprises metal oxide such as sapphire, carbon-containing materials such as diamond, dielectric materials, glass, or polymer such as epoxy. The bonding layer 413 is conductive or non-conductive.

Figure 4E:
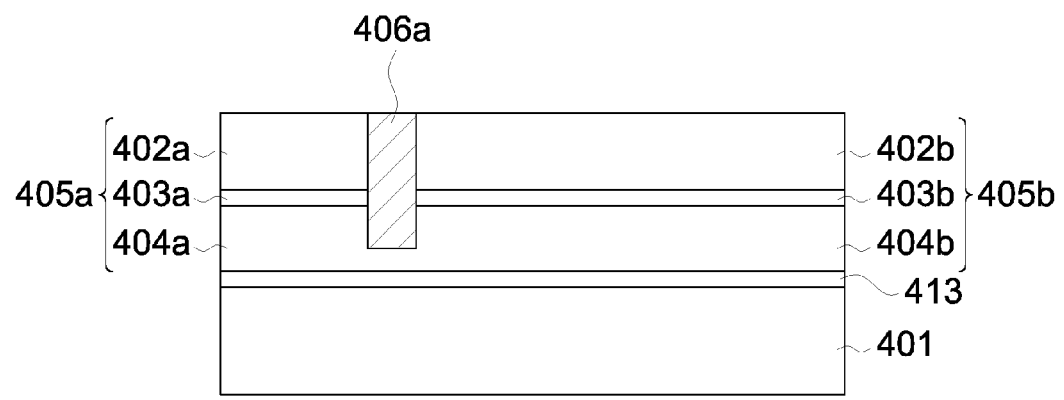
Figure 4F:
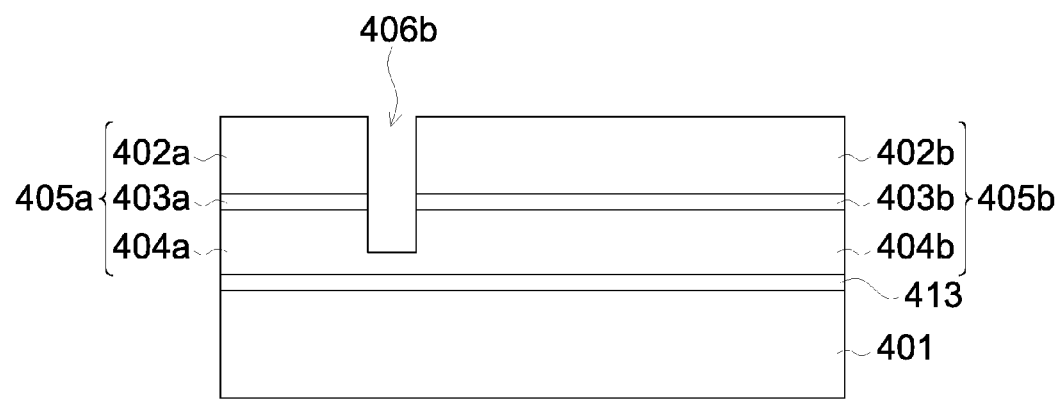
Figure 4G:
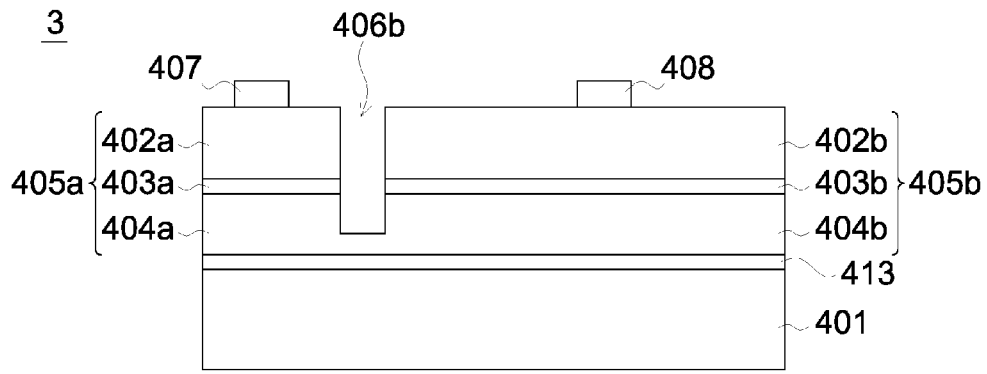
Figure 4G:
Figure 4H:
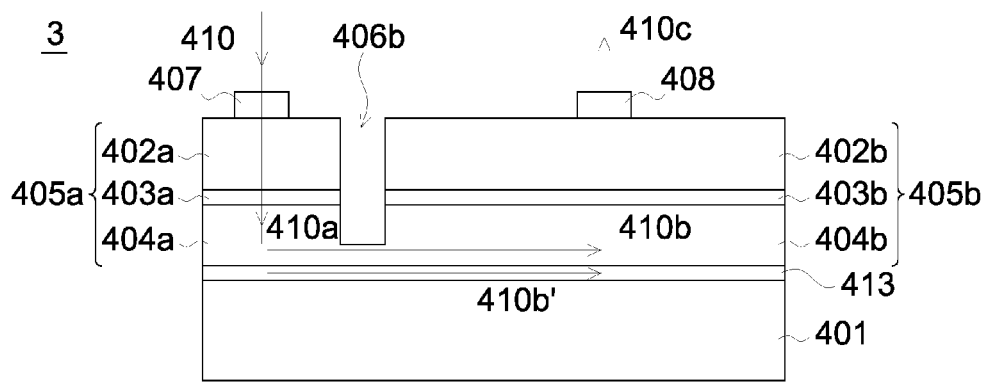
Figure 4H:
Figure 4I:
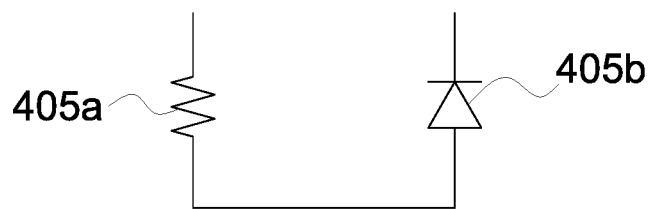

As FIG. 4E shows, an isolation region 406a penetrating the active layer 403 in the semiconductor structure 405 is formed by an ion implantation. More specifically, the isolation region 406a is formed through the first type semiconductor layer 402 and the active layer 403, and reaches the second type semiconductor layer 404 proximal to the substrate 401. Furthermore, the isolation region 406a separates the semiconductor structure 405 into a first part 405b and the second part 405a so the active layer 403 is also separated into a first part 403b and a second part 403a. In another embodiment, the isolation region comprises a trench 406b formed by a wet etching or a dry etching to expose the second type semiconductor layer 404, as shown in FIG. 4F. A second electrode 408 is formed on the first type semiconductor layer 402b of the first part of the semiconductor structure 405b, and a first electrode 407 is formed on the first type semiconductor layer 402a of the second part of the semiconductor structure 405a, so the second electrode 408 and the first electrode 407 are the same conductivity type. The first electrode 407 and the second electrode 408 can be formed simultaneously with the same material. Then a light-emitting device 3 is formed as shown in FIG. 4G(a). The material of the electrodes 407 and 408 comprises metal material such as Cr, Ti, Ni, Pt, Cu, Au, Al, W, Sn, or Ag. FIG. 4G(b) is an equivalent-circuit diagram of the light-emitting device 3 demonstrating the first part 405b and the second part of the semiconductor structure 405a are in reverse polarity series connection. Next, an electrical current is injected across the first electrode 407 and the second electrode 408 to cause a reverse-bias to the second part of the semiconductor structure 405a and a forward-bias to the first part of the semiconductor structure 405b simultaneously. Specifically, a high current density current 410 is injected to the first electrode 407 and goes through the light-emitting device 3, and the paths of the current 410 are shown in FIG. 4H(a). The current 410 goes through the second part of the semiconductor structure 405a from the first type semiconductor layer 402a to the second type semiconductor layer 404a to form a path 410a, goes through the second type semiconductor layer 404 below the trench 406b region horizontally to form a path 410b, goes through the bonding layer 413 (formed of conductive material) horizontally to form a path 410b' and flows to the second electrode 408 through the first part of the semiconductor structure 405b from the second type semiconductor layer 404b to the first type semiconductor layer 402b to form a path 410c. In the embodiment, the current density of the current 410 is greater than 80 A/cm$^2$ or to about 200 A/cm$^2$ with a duration of 0.1 to 1 second such that the reverse-biasing voltage across the second part of the semiconductor structure 405a exceeds the breakdown voltage of the second part of the semiconductor structure 405a to cause the diode behavior of the second part of the semiconductor structure 405a to be permanently broken-down for forming an electrically conductive path and preventing from forming an open circuit. FIG. 4H(b) is an equivalent-circuit diagram of the light-emitting device in FIG. 4H(a). After the diode behavior of the second part of the semiconductor structure 405a is permanently broken-down, only the first part of the active layer 403b can generate the electromagnetic radiation during operation of the light-emitting device 3 while the second part of the active layer 403a can not generate the electromagnetic radiation because a resistor with a low resistance is formed. FIG. 4I is an equivalent-circuit diagram of the light-emitting device 3 after the high current density current 410 is injected across the first electrode 307 and the second electrode 308 and goes through the light-emitting device 3.

Figure 5:
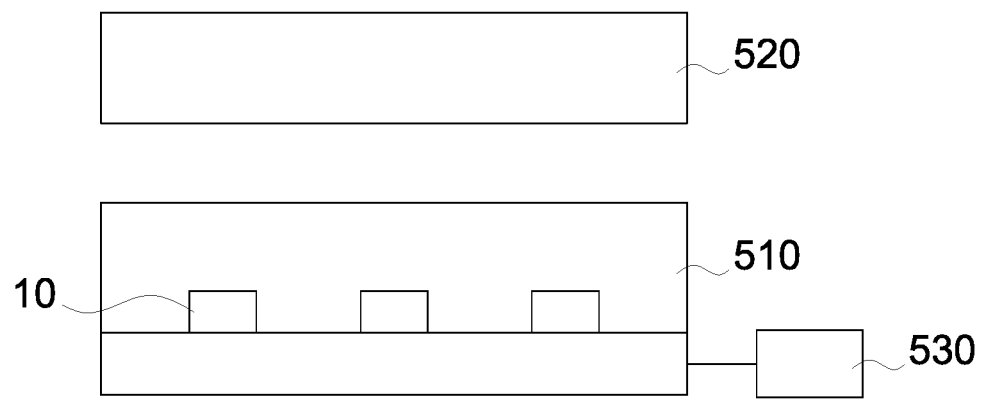
FIG. 5 is a schematic diagram of a backlight module device in accordance with a fourth embodiment of the present application.

FIG. 5 shows a schematic diagram of a backlight module device 500 in accordance with a fourth embodiment of the present application. The backlight module device 500 comprises a light source device 510 having the light-emitting device 1, 2, or 3 in one of the above mentioned embodiments, an optics device 520 deposited on the light extraction pathway of the light source device 510, and a power supplement 530 which provides a predetermined power to the light source device 510. In FIG. 5 shows only the light-emitting device 1, but the light-emitting device includes but is not limited to light-emitting device 1, 2, 3 or the combination thereof.

Figure 6:
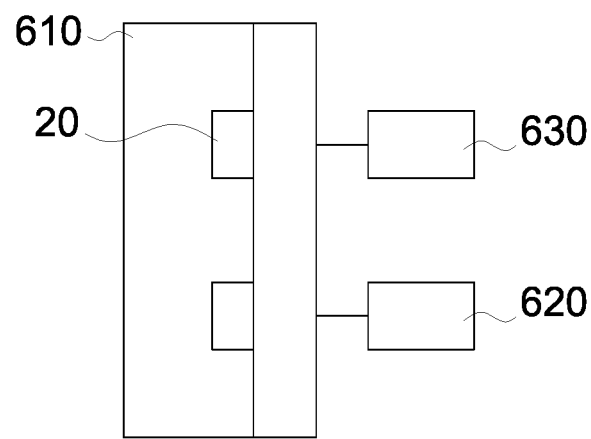
FIG. 6 is a schematic diagram of an illumination device in accordance with a fifth embodiment of the present application.

FIG. 6 shows a schematic diagram of an illumination device 600 in accordance with a fifth embodiment of the present application. The illumination device 600 can be automobile lamps, street lights, flashlights, indicator lights and so forth. The illumination device 600 comprises a light source device 610 having the light-emitting device 1, 2, or 3 in one of the above mentioned embodiments, a power supplement 620 which provides a predetermined power to the light source device 610, and a control element 630 which controls the current driven into the light source device 610. In FIG. 6 shows only the light-emitting device 1, but the light-emitting device includes but is not limited to light-emitting device 1, 2, 3 or the combination thereof.

In accordance with the embodiments in the application, the first type semiconductor layer 102, 302, or 402 and the second type semiconductor layer of the semiconductor structure 104, 304, or 404 are two single-layer structures or two multiple layers structure ("multiple layers" means two or more than two layers) having different electrical properties, polarities, dopants for providing electrons or holes respectively. If the first type semiconductor layer and the second type semiconductor layer are composed of the semiconductor materials, the conductivity type can be any two of p-type, n-type, and i-type. The active layer 103, 303, or 403 disposed between the first type semiconductor layer 102, 302, or 402 and the second type semiconductor layer 104, 304, or 404 is a region where the light energy and the electrical energy could transfer or could be induced to transfer.

In another embodiment of this application, the light emission spectrum of the semiconductor structure 105, 305, or 405 after transferring can be adjusted by changing the physical or chemical arrangement of one layer or more layers in the active layer. The material of the active layer can be AlGaInP series material or AlGaInN series material. The structure of the active layer can be a single heterostructure (SH), a double heterostructure (DH), a double-side double heterostructure (DDH), or a multi-quantum well (MQW) structure. Besides, the wavelength of the emitted light could also be adjusted by changing the number of the pairs of the quantum well in a MQW structure.

In one embodiment of this application, a buffer layer (not shown) could be optionally formed between the substrate and the semiconductor structure. The buffer layer between two material systems can be used as a buffer system. For the structure of the light-emitting device, the buffer layer is used to reduce the lattice mismatch between two material systems. On the other hand, the buffer layer could also be a single layer, multiple layers, or a structure to combine two materials or two separated structures where the material of the buffer layer can be organic, inorganic, metal, semiconductor, and so on, and the function of the buffer layer can be as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on. The material of the buffer layer can be AlN, GaN, InP, GaP or other suitable materials. The fabricating method of the buffer layer can be sputter or atomic layer deposition (ALD).

A contact layer (not shown) can also be optionally formed on the semiconductor structure. The contact layer is disposed on the second type semiconductor layer opposite to the active layer. Specifically speaking, the contact layer could be an optical layer, an electrical layer, or the combination of the two. An optical layer can change the electromagnetic radiation or the light from or entering the active layer. The term "change" here means to change at least one optical property of the electromagnetic radiation or the light. The above mentioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, or capacitance between any pair of the opposite sides of the contact layer. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 μm-0.6 μm.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprises:
   a semiconductor structure comprising a first type semiconductor layer comprising a first surface and a second surface opposite to the first surface, a second type semiconductor layer comprising a third surface facing the first type semiconductor layer and a fourth surface opposite to the third surface, and an active layer between the first type semiconductor layer and the second type semiconductor layer and comprising a fifth surface connecting the second surface and a sixth surface connecting the third surface;
   an isolation region penetrating through the fourth surface, the third surface of the second type semiconductor, the fifth surface and the sixth surface of the active layer to separate the semiconductor structure into a first part and a second part;
   a first electrode directly on and overlapped with the second part of the semiconductor structure; and
   a second electrode directly on and overlapped with the first part of the semiconductor structure,
   wherein the active layer in the first part is capable of generating light, and the active layer in the second part is incapable of generating light, and the second type semiconductor layer is nearer the first electrode and the second electrode than the first type semiconductor layer.

2. The light-emitting device according to claim 1, further comprising a substrate under the semiconductor structure, wherein the substrate comprises a too surface and a lower surface farther from the semiconductor structure than the too surface.

3. The light-emitting device according to claim 2, further comprising a third electrode on the lower surface of the substrate.

4. The light-emitting device according to claim 3, wherein the second part of the semiconductor structure is capable of allowing a current passing through either in forward direction from the first electrode to the second electrode or in reverse direction from the third electrode to the first electrode.

5. The light-emitting device according to claim 2, wherein the first type semiconductor layer is between the active layer and the substrate.

6. The light-emitting device according to claim 2, further comprising a bonding layer between the semiconductor structure and the substrate.

7. The light-emitting device according to claim 2, further comprising a reflecting layer between the semiconductor structure and the substrate.

8. The light-emitting device according to claim 1, wherein the isolation region comprises a trench.

9. The light-emitting device according to claim 8, wherein the trench comprises an etched region.

10. The light-emitting device according to claim 1, further comprising a third electrode under the semiconductor structure and opposite to the first electrode.

11. The light-emitting device according to claim 10, wherein the second part of the semiconductor structure is capable of allowing a current passing through either in forward direction from the first electrode to the second electrode or in reverse direction from the third electrode to the first electrode.

12. The light-emitting device according to claim 1, further comprising a reflecting layer under the semiconductor structure.

13. The light-emitting device according to claim 12, further comprising a bonding layer between the semiconductor structure and the reflecting layer.

14. The light-emitting device according to claim 1, wherein the isolation region comprises an ion implanted region.

15. The light-emitting device according to claim 1, wherein the first type semiconductor layer is a continuous layer.

16. The light-emitting device according to claim 1, wherein the isolation region is not entirely through the first type semiconductor layer.

17. The light-emitting device according to claim 1, wherein the first part is connected to the second part by a part of the first type semiconductor layer directly under the isolation region.

18. The light-emitting device according to claim 1, wherein the isolation region is not through the first surface of the first type semiconductor layer.

19. The light-emitting device according to claim 1, wherein the isolation region penetrates through the second surface of the first type semiconductor layer.

20. The light-emitting device according to claim 19, wherein the isolation region exposes a part of the first type semiconductor layer connecting the first part and the second.

* * * * *